United States Patent
Chen et al.

(10) Patent No.: US 10,860,062 B2
(45) Date of Patent: Dec. 8, 2020

(54) FLEXIBLE DISPLAY DEVICE AND METHOD FOR DIVIDING FLEXIBLE DISPLAY

(71) Applicant: Wistron Corporation, New Taipei (TW)

(72) Inventors: Yuan-Tai Chen, New Taipei (TW); Chia-Hao Liang, New Taipei (TW)

(73) Assignee: Wistron Corporation, New Taipei (TW)

( * ) Notice: Subject to any disclaimer, the term of this patent is extended or adjusted under 35 U.S.C. 154(b) by 2 days.

(21) Appl. No.: 15/981,911

(22) Filed: May 17, 2018

(65) Prior Publication Data

US 2019/0278334 A1    Sep. 12, 2019

(30) Foreign Application Priority Data

Mar. 7, 2018    (TW) .............................. 107107778 A

(51) Int. Cl.
*G06F 1/16*        (2006.01)
*G06F 3/041*        (2006.01)
(Continued)

(52) U.S. Cl.
CPC .......... *G06F 1/1652* (2013.01); *G06F 3/0412* (2013.01); *H04M 1/0268* (2013.01);
(Continued)

(58) Field of Classification Search
CPC ................. G06F 1/1652; G06F 3/0412; G06F 2203/04102; G06F 2203/04105;
(Continued)

(56) References Cited

U.S. PATENT DOCUMENTS

| 7,046,018 B2 | 5/2006 | Toda et al. |
| 9,606,648 B2 | 3/2017 | Seo et al. |

(Continued)

FOREIGN PATENT DOCUMENTS

| JP | 2013196623 | 9/2013 |
| JP | 2013218694 | 10/2013 |

(Continued)

OTHER PUBLICATIONS

Office Action of Taiwan Counterpart Application, dated Sep. 18, 2018, pp. 1-9.

(Continued)

*Primary Examiner* — Temesghen Ghebretinsae
*Assistant Examiner* — Karin Kiyabu
(74) *Attorney, Agent, or Firm* — JCIPRNET

(57) ABSTRACT

A flexible display device and method for dividing flexible display are provided. The flexible display device comprises a flexible display, a bend detector, a microcontroller, and a processor. The bend detector is set on the flexible display. The microcontroller is coupled to the bend detector, and the microcontroller detects a bend position of the bend detector on the flexible display according to the bend detector. The processor is coupled to the microcontroller and the flexible display. The processor divides the flexible display into at least two display areas according to the bend position, and respectively controls at least two display areas with different screen operations.

8 Claims, 8 Drawing Sheets

(51) Int. Cl.
*H04M 1/02* (2006.01)
*H05K 1/02* (2006.01)

(52) U.S. Cl.
CPC .............. *G06F 2203/04102* (2013.01); *G06F 2203/04105* (2013.01); *H05K 1/028* (2013.01)

(58) Field of Classification Search
CPC ......... G06F 2203/04803; G06F 1/1641; G06F 1/1694; G06F 3/0481; H04M 1/0268; H04M 1/0214; G09G 2380/02; H05K 1/028
See application file for complete search history.

(56) References Cited

U.S. PATENT DOCUMENTS

| | | | |
|---|---|---|---|
| 9,886,187 B2 | 2/2018 | Seo et al. | |
| 9,952,706 B2 | 4/2018 | Cho et al. | |
| 10,585,456 B2* | 3/2020 | Sohn | G06F 1/1652 |
| 2003/0179003 A1 | 9/2003 | Toda et al. | |
| 2011/0298762 A1 | 12/2011 | Lin | |
| 2013/0215011 A1* | 8/2013 | Ke | G06F 3/03 345/156 |
| 2013/0265260 A1 | 10/2013 | Seo et al. | |
| 2014/0028597 A1 | 1/2014 | Cho et al. | |
| 2014/0078047 A1 | 3/2014 | Seo et al. | |
| 2014/0098095 A1* | 4/2014 | Lee | G06F 3/041 345/420 |
| 2014/0101560 A1 | 4/2014 | Kwak et al. | |
| 2014/0331781 A1* | 11/2014 | Lee | G01N 3/20 73/849 |
| 2015/0316995 A1 | 11/2015 | Tamaki | |
| 2016/0195938 A1* | 7/2016 | Kim | H04B 1/3827 345/156 |
| 2016/0378249 A1* | 12/2016 | Miura | G06F 3/0416 345/174 |
| 2017/0040562 A1* | 2/2017 | Kim | H01L 27/3276 |
| 2017/0123558 A1* | 5/2017 | Hong | G06F 3/0412 |
| 2017/0160899 A1 | 6/2017 | Seo et al. | |
| 2017/0235343 A1* | 8/2017 | Cho | G06F 1/1681 361/679.27 |

FOREIGN PATENT DOCUMENTS

| | | |
|---|---|---|
| JP | 2015228207 | 12/2015 |
| KR | 100886281 | 3/2009 |
| KR | 1020140028257 | 3/2014 |
| TW | 201331823 | 8/2013 |
| TW | 201413498 | 4/2014 |
| TW | 201415343 | 4/2014 |
| TW | I553545 | 10/2016 |
| TW | I604348 | 11/2017 |
| TW | I619113 | 3/2018 |

OTHER PUBLICATIONS

"Office Action of Korea Counterpart Application," with English translation thereof, dated Aug. 29, 2019, p. 1-p. 12.
"Office Action of Japan Counterpart Application," dated Jul. 30, 2019, p. 1-p. 6.

* cited by examiner his application claims the priority benefit of Taiwan application serial no. 107107778, filed on Mar. 7, 2018. The entirety of the above-mentioned patent application is hereby incorporated by reference herein and made a part of this specification.

FLEXIBLE DISPLAY DEVICE AND METHOD FOR DIVIDING FLEXIBLE DISPLAY

CROSS-REFERENCE TO RELATED APPLICATION

This application claims the priority benefit of Taiwan application serial no. 107107778, filed on Mar. 7, 2018. The entirety of the above-mentioned patent application is hereby incorporated by reference herein and made a part of this specification.

BACKGROUND

Field of the Disclosure

The disclosure is related to a control technique of a flexible display, and particularly to a flexible display device and a method of dividing flexible display.

Description of Related Art

Along with advancement of technologies, the use of flexible display panel is becoming more widespread. For example, flexible display panel has been widely applied to wearable device, mobile phone and TV. Devices commonly used in daily lives may all be equipped with flexible display panel, which represents that there is huge potential for the market of flexible display panel.

Currently, products with flexible display panel are designed to have full-screen or narrow frame. Typically, in the condition that the flexible display panel product is folded, user normally sees a bent display image. Since the display image is bent, the user may not be able to see the display image on the flexible display panel clearly. On the other hand, in practical application, the flexible display panel may be coordinated with flexible touch technique to realize multiple functions. Accordingly, further research and studies may be conducted to explore how to enable the flexible display panel to realize diverse functions in circumstances of being folded/unfolded.

SUMMARY

The disclosure provides a flexible display device and a method of dividing a flexible display, which achieves the effect of dividing images through using a bend detector to detect a bend position on the flexible display, and realizing different functions on a plurality of divided screens respectively.

The disclosure provides a flexible display device, including a flexible display, a bend detector, a microcontroller and a processor. The bend detector is disposed on or in the flexible display. The microcontroller is coupled to the bend detector. The microcontroller detects a bend position of the flexible display on the flexible display according to the bend detector. The processor is coupled to the microcontroller and the flexible display. The processor divides the flexible display into at least two display areas according to the bend position, and controls the at least two display areas according to different screen operations.

The disclosure provides a method of dividing a flexible display, including detecting a bend position of a bend detector on the flexible display according to a bend detector, dividing the flexible display into at least two display areas according to the bend position, and controlling the at least two display areas with different screen operations respectively.

According to the above, the flexible display device provided in the disclosure detects the bend position on the flexible display to determine whether to divide the flexible display into at least two display images performing different screen operations. In this manner, the flexible display device may determine how many display areas should be divided on the flexible display according to how the user bends the flexible display, thereby achieving the effect of dividing image and realizing different functions on the plurality of divided screens. Additionally, in the condition that the user bends the flexible display device randomly, the disclosure may determine the bend status of the flexible display device dynamically, thereby determining how many display images are required on the flexible display device and determining the position of the display images. Accordingly, the disclosure may improve the efficiency of determining the number and positions of the display images on the flexible display device.

In order to make the aforementioned features and advantages of the disclosure more comprehensible, embodiments accompanying figures are described in detail below.

DESCRIPTION OF EMBODIMENTS

Figure 1:
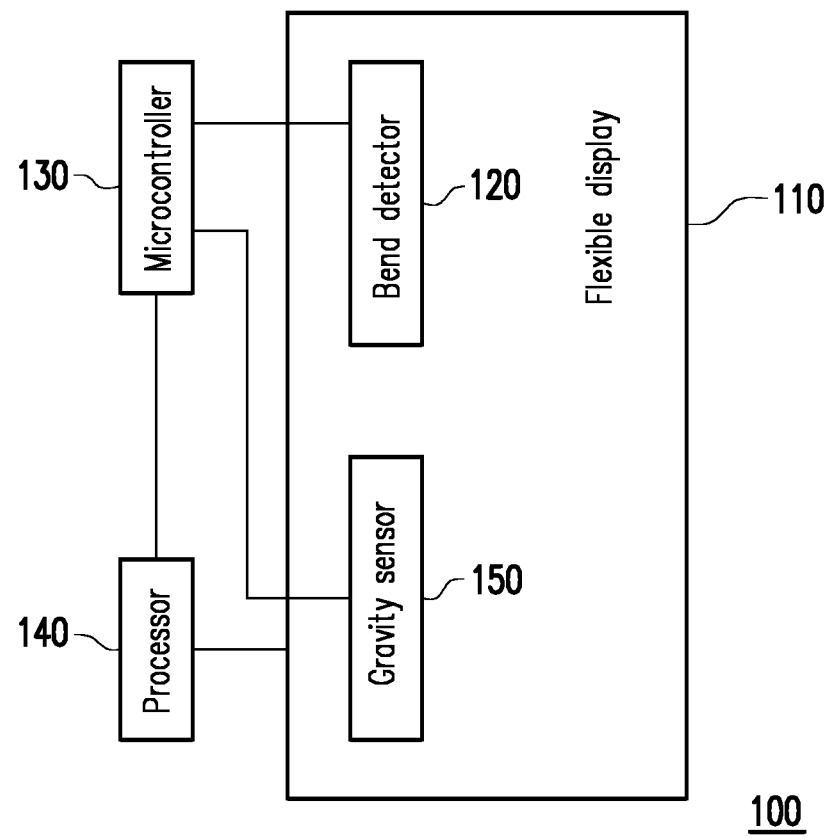
FIG. 1 is a block view of a flexible display device according to an exemplary embodiment of the disclosure.

FIG. 1 is a block view of a flexible display device according to an exemplary embodiment of the disclosure. Referring to FIG. 1, a flexible display device 100 includes a flexible display 110, a bend detector 120, a microcontroller 130 and a processor 140. The bend detector 120 is disposed on a random position of the flexible display 110, wherein the bend detector 120 may be one or more linear detectors.

Those who apply the embodiment may adjust the position of the bend detector 120 arranged on the flexible display 110 randomly depending on the need; the disclosure provides no limitation to the position of the bend detector or how the bend detector is arranged. It should be indicated that the bend detector 120 may be adhered to the flexible display 110 through physical means, or directly disposed in the flexible display 110 through a semiconductor manufacturing process. The embodiment provides no limitation to the technique of how the bend detector 120 is disposed on the flexible display 110.

The microcontroller 130 is coupled to the bend detector 120, and detects the bend position of the bend detector 120 on the flexible display 110 according to the bend detector 112. Specifically, since the bend detector 120 is disposed on or in the flexible display 110, when the flexible display 110 is bent, the bend detector 120 is likely to be bent at the same time. In such circumstances, the flexible display 110 and the bend detector 120 have the same bend position. In this manner, the microcontroller 130 may determine whether the flexible display 110 is bent. If the microcontroller 130 determines that the bend detector 120 is bent, the microcontroller 130 may determine the bend position at which the bend detector 120 is bent, namely the bend position at which the flexible display 110 is bent. The microprocessor 140 is coupled to the microcontroller 130. The processor 140 may divide the flexible display 110 into at least two display areas according to the bend position, and controls the at least two display areas according to different screen operations. In other words, when more bend positions are detected, the processor 140 performs calculation according to the bend positions to divide the flexible display 110 into more display areas, for example, when the flexible display 110 is bent one time, the processor 140 performs calculation to divide the flexible display 110 into two display areas.

According to an embodiment of the disclosure, the flexible display 100 further includes a gravity sensor 150. The gravity sensor 150 may be a sensor for sensing direction of gravity, and the number of gravity sensor 150 may be one or more. The one or more gravity sensors 150 may be disposed on or in a random position of the flexible display 110 according to the need of those who apply the embodiment. The microcontroller 130 may detect a bend angle of the flexible display 110 according to the gravity sensor 150. Specifically, when the flexible display 110 is bent, the microcontroller 130 may receive a signal of the gravity sensor 150 and determine the bend angle of the bend position. Additionally, the user may set a predetermined bend angle, or the flexible display 110 stores the predetermined bend angle in a storage medium, a cloud or a server and so forth (not shown) of any form in advance. In this manner, the processor 140 may determine whether the bend angle is larger than the predetermined bend angle. If the bend angle is larger than the predetermined bend angle, the processor 140 may divide the flexible display 110 into at least two display areas according to the bend position, thereby avoiding that the flexible display 110 is divided into at least two display areas when the user unconsciously bends the flexible display 110.

The processor 140 may respectively set the at least two display areas as a touch area, a display image or a closed image according to the bend angle. For example, when the flexible display 110 has one bend angle that is 180 degrees, the processor 140 may divide the flexible display 110 into two display areas, set one of the display areas as a display image, and set the other display area as a touch area to allow the user to perform various inputs. Alternatively, when the flexible display 110 has a bend angle that is smaller than 180 degrees, the processor 140 may divide the flexible display 110 into two display areas, and set both of the two display areas as display images.

The processor 140 may preset a bend distance, and displays the position of the flexible display corresponding to the bend position as a blank image according to the bend distance. Specifically, the processor 140 may preset a bend distance, and store the bend distance in a storage medium, a cloud or a server and so on (not shown) of any forms. In this manner, the processor 140 may display the position of the flexible display 110 corresponding to the bend position as a blank image according to the bend distance. The processor 140 may intercept a bend distance along the bend detector 120 at the bend position and display a blank image of which a width is the bend distance at the bend position.

The flexible display 110 may be a display using a flexible organic light emitting diode. The bend detector 120 may be linear and has a plurality of resistors connected in parallel, wherein the length D1 of the bend detector is proportional to the resistance of the bend detector. The microcontroller 130 may detect the resistance of the bend detector 120, and determine the bend position of the bend detector 120 according to the resistance.

The processor 140 may be a north bridge, a south bridge, a field programmable array (FPGA), a programmable logic device (PLD), an application specific integrated circuits (ASIC) or other similar devices or a combination of the above. The processor may also be a central processing unit (CPU), an application processor (AP), or other programmable general-purpose or specific-purpose microprocessor, a digital signal processor (DSP), a graphic processing unit (GPU), or other devices or a combination of the above.

Figure 2A:
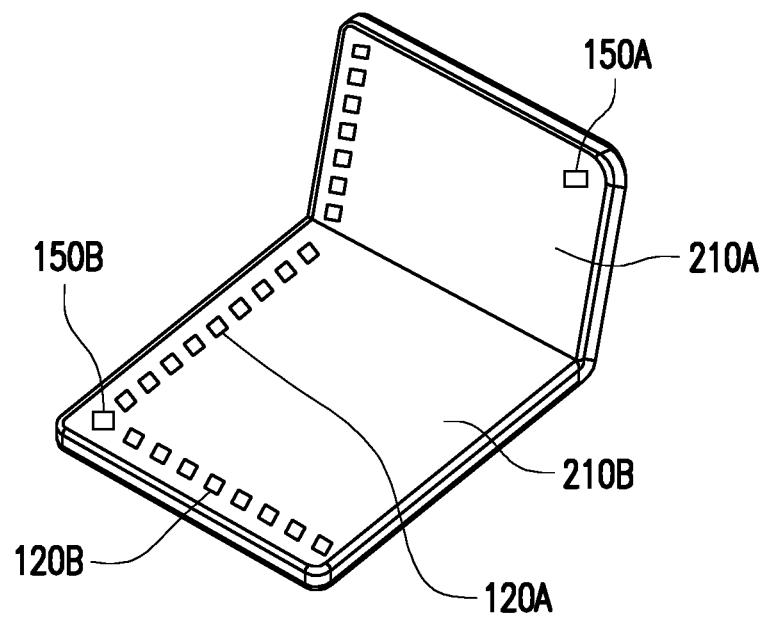
FIG. 2A to FIG. 2C are schematic views of dividing a flexible display according to an exemplary embodiment of the disclosure.
Figure 2B:
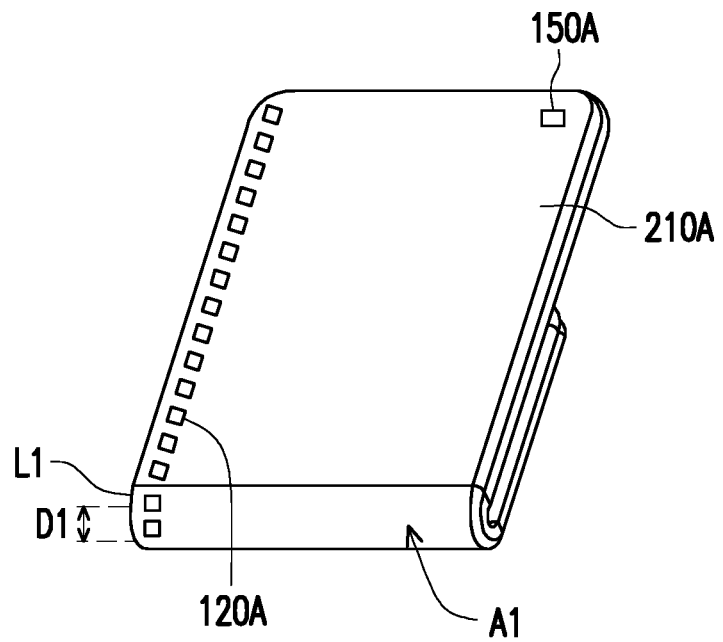
Figure 2C:
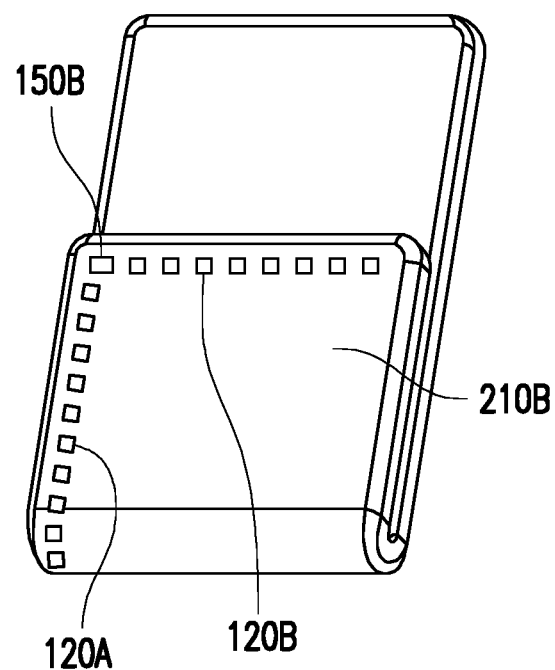

FIG. 2A to FIG. 2C are schematic views of dividing a flexible display according to an exemplary embodiment of the disclosure. Referring to FIG. 1A and FIG. 2A, bend detectors 120A and 120B may be disposed on or in a lateral side and a bottom side of the flexible display 110. Gravity sensors 150A and 150B may be disposed at opposite corners of the flexible display 110. When the flexible display 110 is bent, the microcontroller 130 detects the bend position on the flexible display 110 through the bend detector 120A, and the gravity sensors 150A and 150B sense the bend angle between the display areas 210A and 210B. The processor 140 may control the display areas 210A and 210B by respectively performing different screen operations in the display areas 210A and 210B. In other words, the processor 140 may respectively execute a first display image and a second display image in the display areas 210A and 210B. The processor 140 may determine whether to perform different screen operations in the display areas 210A and 210B respectively according to the bend angle. Furthermore, the processor 140 may determine whether the bend angle is larger than a predetermined bend angle. If so, the processor 140 performs different screen operations in the display areas 210A and 210B respectively; if not, the processor 140 does not perform any operations. The processor 140 may further determine to display a touch area, a display image or a closed image in the display areas 210A and 210B according to the bend angle.

Referring to FIG. 1, FIG. 2B and FIG. 2C, when the bend angle is 180 degrees, the processor 140 may set the display area 210A as a first display image, and similarly set the display area 210B as a second display image, or set the display area 210B as the touch area or the closed area. On the contrary, the processor 140 may set the display area 210A as the first display image, and set the display area 210B as the second display image, or set the display area 210B as the touch area or the closed image. Accordingly, the disclosure provides no limitation to setting each of the display areas as the display image, the touch area or the closed image. It should be indicated that, in such circumstances, the processor 140 may preset a bend distance D1, and displays the position of the flexible display 110 corresponding to the bend position as the blank image according to the bend distance D1. Specifically, the flexible display 110 has a bend area A1 at the bend position. The microcontroller 130 may identify a length L1 of the bend detector 120 in the bend area A1. The processor 140 may preset a bend distance D1, and intercept the bend distance DI from the length L1 along the bend detector 120 to intercept a blank area of which the width is the bend distance D1 from the bend area A1, thereby setting the blank area as the blank image.

Figure 3A:
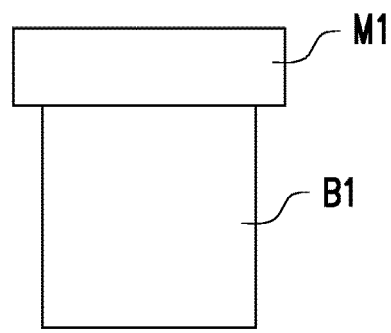
FIG. 3A to FIG. 3C are schematic views of a bend detector according to an exemplary embodiment of the disclosure.
Figure 3B:
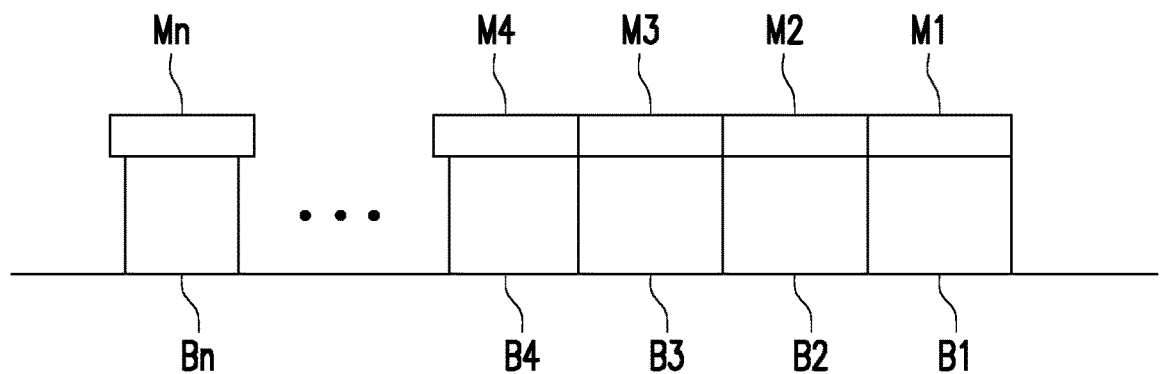
Figure 3C:
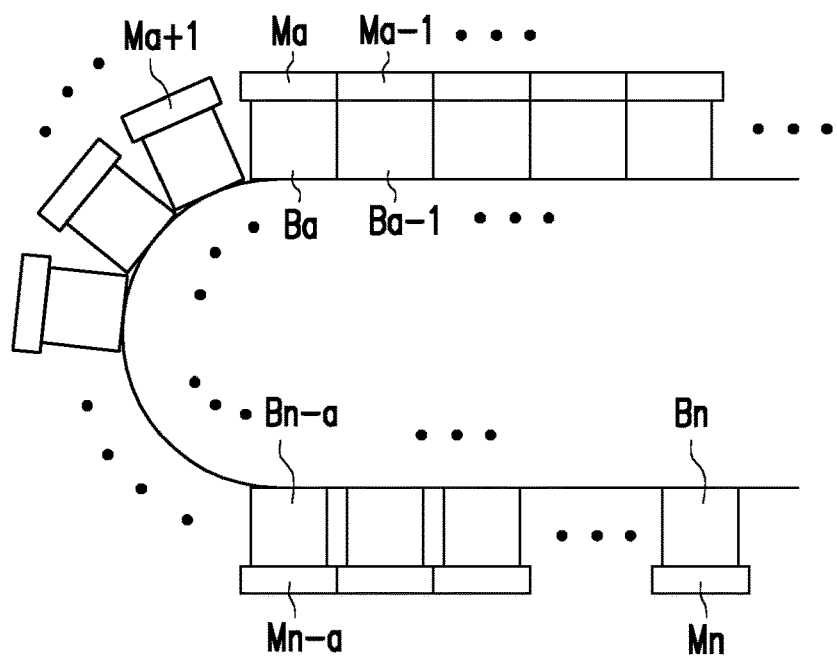

FIG. 3A to FIG. 3C are schematic views of a bend detector according to an exemplary embodiment of the disclosure. Referring to FIG. 3A, the bend detector may be formed as a structure in which a foam conductive material layer M1 is disposed on a substrate B1. The bend detector may be disposed on the flexible display. It should be indicated that the foam conductive material layer M1 may be regarded as a parallel resistor, and the lateral side of the foam conductive material layer M1 has a protruded portion, the protruded portion ensures that the foam conductive material layer M1 can be connected with adjacent foam conductive material layer and maintains closed-circuit. Referring to FIG. 3B, a plurality of foam conductive material layers M1-Mn are respectively disposed on a plurality of substrates B1-Bn. The plurality of foam conductive material layers M1-Mn and the plurality of substrates B1-Bn may be arranged on the flexible display. In the condition that the flexible display is not bent, the plurality of foam conductive material layers M1-Mn may be closely connected to adjacent foam conductive material layer respectively and maintain the closed-circuit status, which may be regarded that a plurality of resistors are connected in parallel. Referring to FIG. 3C, in the condition that the flexible display is bent, the foam conductive material layers Ma-Mn-a at the bend position cannot be connected to adjacent foam conductive material layer, and an open-circuit status is formed. In such circumstances, only the resistance of the foam conductive material layers M1-Ma and Mn-a+1-Mn may be detected. In this manner, the microcontroller may determine the bend position of the flexible display according to the resistance.

Figure 4A:
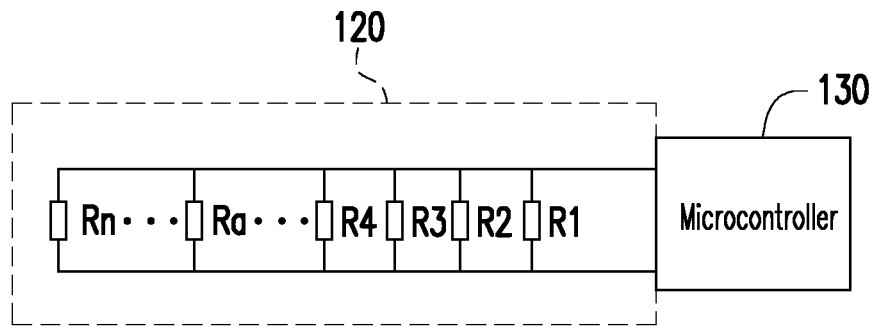
FIG. 4A to FIG. 4F are schematic views of a microcontroller coupled to a bend detector according to an exemplary embodiment of the disclosure.
Figure 4B:
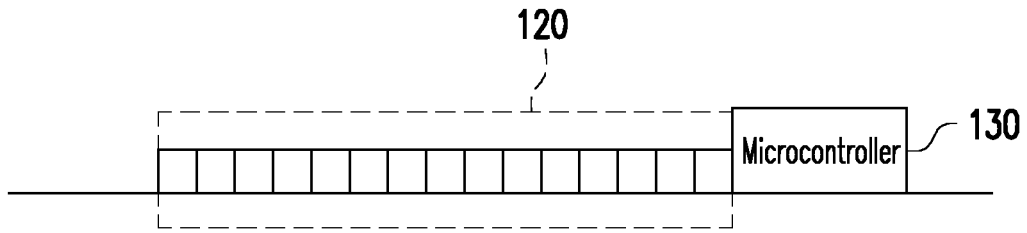
Figure 4C:
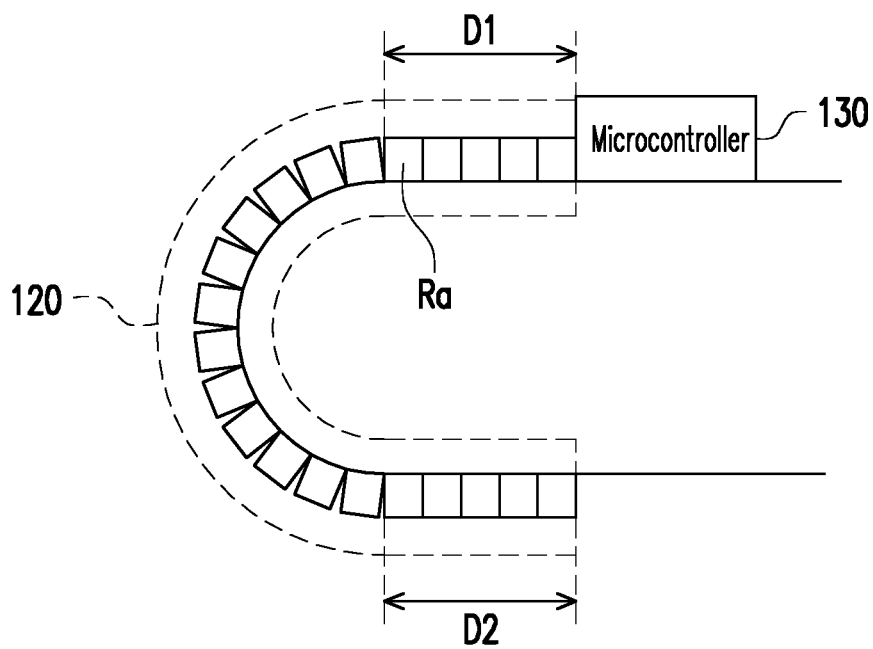

FIG. 4A to FIG. 4F are schematic views of a microcontroller coupled to a bend detector according to an exemplary embodiment of the disclosure. Referring to FIG. 4A to FIG. 4C, the microcontroller 130 may be coupled to one end of the bend detector 120, wherein the bend detector 120 is linear and has a plurality of resistors R1-Rn connected in parallel. In the condition that the bend detector 120 is not bent, all of the resistors R1-Rn may maintain closed-circuit status. The microcontroller 130 may determine that the bend detector 120 is not bent by detecting the resistance of resistors R1-Rn at one end of the bend detector 120. In the condition that the bend detector 120 is bent, the linear is disconnected at the bend position, that is, an open-circuit is formed between the resistors Ra-Rn-a+1. In other words, when the bend angle is larger, the bend detector 120 has more resistors formed as open-circuit. Therefore, the bend angle of the bend detector 120 is inversely proportional to the number of the resistor which maintains closed-circuit. That is to say, the unbent length D1 of the bend detector 120 is inversely proportional to the resistance of the bend detector 120. Specifically, the microcontroller 130 may detect the resistance of the resistors R1-Ra, and calculate the unbent length D1 of the parallel resistors R1-Ra on the bend detector 120 according to the resistance of the resistors R1-Ra. In this manner, the microcontroller 130 may determine the bend position of the bend detector 120 according to the unbent length D1. For example, assuming that n=10, a=4, R1=R2=R3 . . . =R10=10K ohm, in the condition that the bend detector 120 is not bent, microcontroller 130 may detect that the impedance of the bend detector 120 is $$\frac{1}{\frac{1}{R1}+\frac{1}{R2}+\cdots+\frac{1}{R10}}=\frac{1}{\frac{1}{10K}+\frac{1}{10K}+\cdots+\frac{1}{10K}}=1K\ ohm.$$

Since the bend detector 120 is bent at the position of R4, the microcontroller 130 may detect that the impedance of the bend detector 120 is $$\frac{1}{\frac{1}{R1}+\frac{1}{R2}+\frac{1}{R3}+\frac{1}{R4}}=\frac{1}{\frac{1}{10K}+\frac{1}{10K}+\frac{1}{10K}+\frac{1}{10K}}=2.5K\ ohm.$$

In this manner, since the impedance of the bend detector 120 is only associated with the length D1 of the bend detector, and the bend detector 120 cannot acquire a length D2, the microcontroller 130 can only acquire the length D2 via estimation. Furthermore, in the condition that the bend detector 120 is bent at the position of R4, the microcontroller 130 may estimate that the bend detector 120 is bent at the position of R7. In this manner, the microcontroller 130 may determine that the bend position is between R4-R7, and calculates the length of D2 according to the resistance of R7-R10.

Figure 4D:
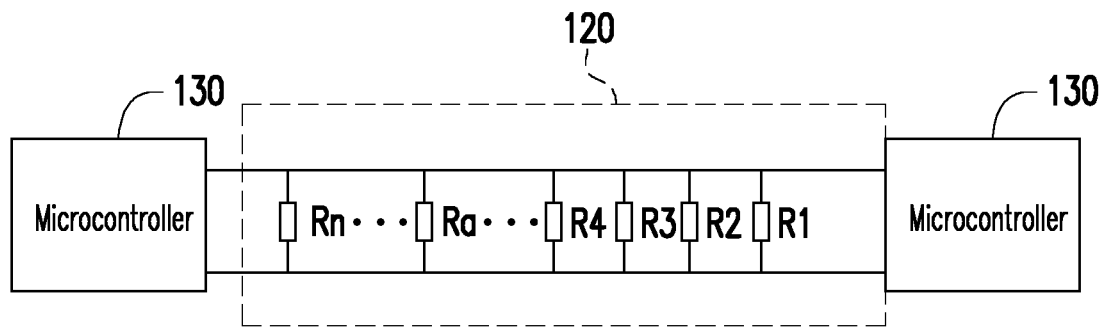
Figure 4E:
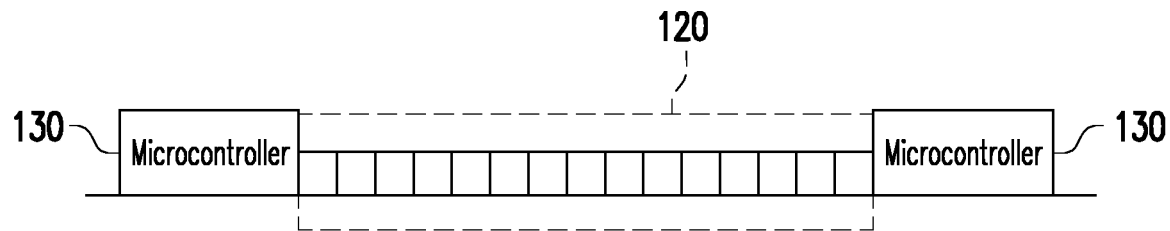
Figure 4F:
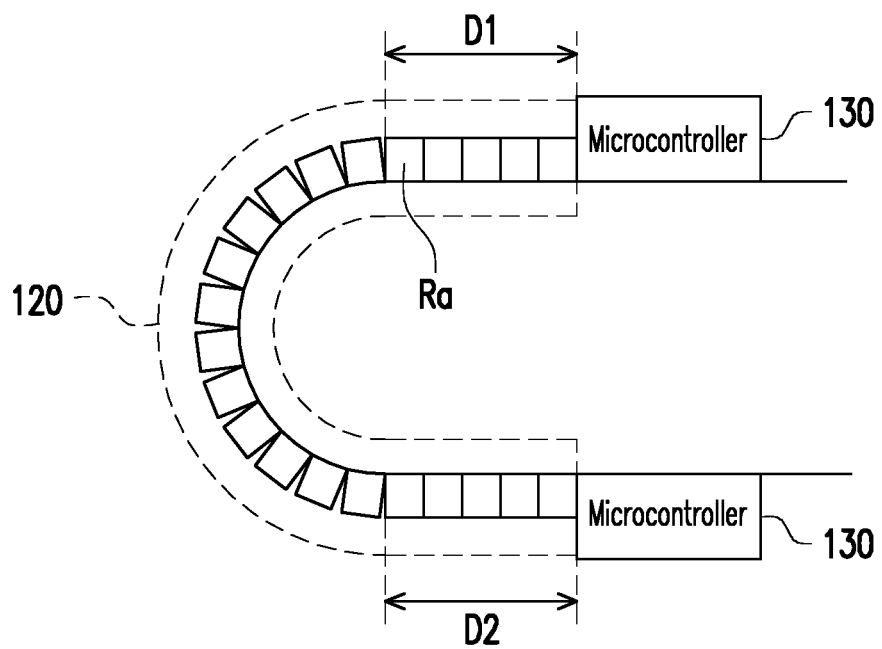

Referring to FIG. 4D to FIG. 4F, the two microcontrollers 130 may be coupled to two terminals of the bend detector 120, wherein the two microcontrollers 130 may be coupled together. Similarly, in the condition that the bend detector 120 is not bent, the two microcontrollers 130 may determine that the bend detector 120 is not bent by detecting the resistance of the resistors R1-Rn at two terminals of the bend detector 120. In the condition that the bend detector 120 is bent, the two microcontrollers 130 may respectively detect the resistance of the resistors R1-Ra and resistors Rn-a+1-Rn, and directly calculate the unbent length D1 of the parallel resistors R1-Ra and the unbent length D2 of the parallel resistors Rn-a+1-Rn on the bend detector 120 according to the resistance of the resistors R1-Ra and the resistors Rn-a+1-Rn. In this manner, one of the two microcontrollers 130 may receive the unbent length of the other, and determine the bend position of the bend detector 120 according to the unbent length D1 and D2.

Figure 5A:
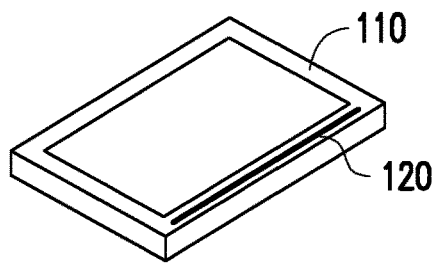
FIG. 5A to FIG. 5D are schematic views of a bend detector disposed on a flexible display according to an exemplary embodiment of the disclosure.
Figure 5B:
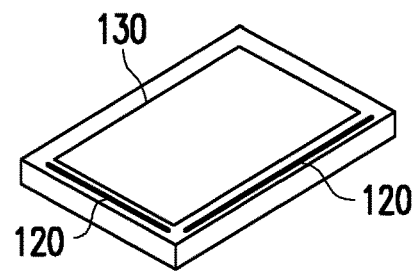
Figure 5C:
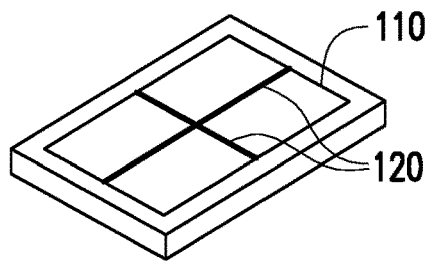
Figure 5D:
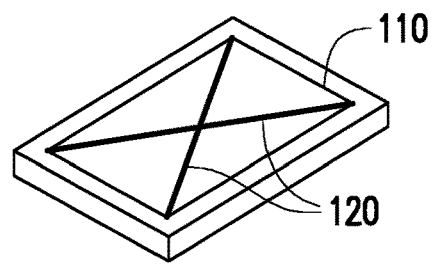

FIG. 5A to FIG. 5D are schematic views of a bend detector disposed on a flexible display according to an exemplary embodiment of the disclosure. Referring to FIG. 5A, in the embodiment, a bend detector 120 may be disposed at any lateral side along the display area of the flexible display 110. Referring to FIG. 5B, in the embodiment, a bend detector 120 is disposed respectively on the bottom side and lateral side of the flexible display 110. Referring to FIG. 5C, in the embodiment, two bend detectors 120 may disposed on the flexible display 110 in a crossed manner. Referring to FIG. 5D, in the embodiment, two bend detectors 120 may be disposed on a diagonal line of the flexible display 110 in an interlaced manner.

Figure 6A:
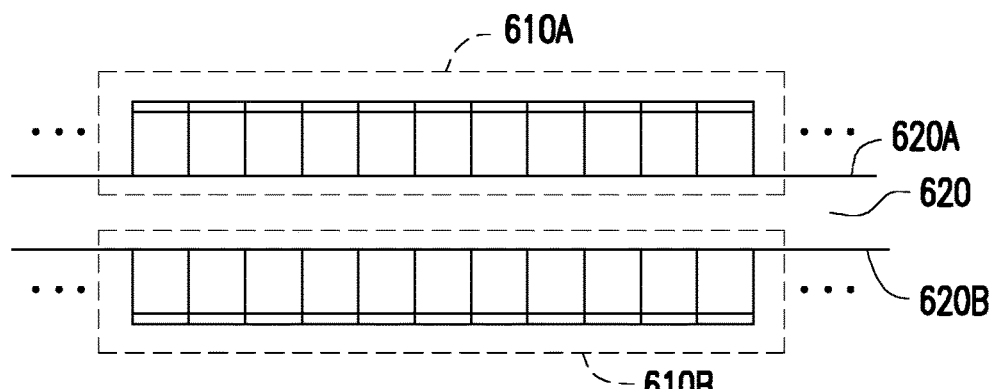
FIG. 6A and FIG. 6B are schematic views of a bend detector disposed on front and back of a flexible display according to another exemplary embodiment of the disclosure.
Figure 6B:
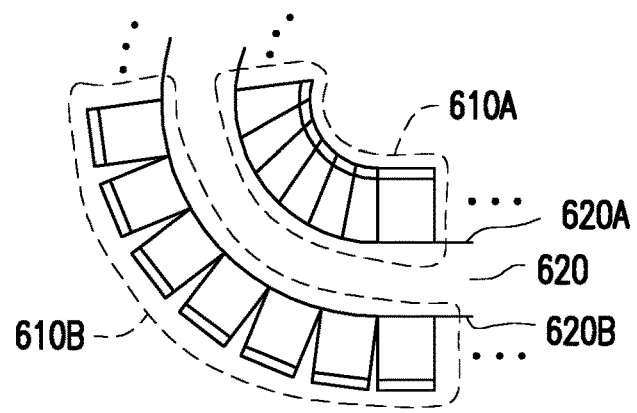

FIG. 6A and FIG. 6B are schematic views of a bend detector disposed on front and back of a flexible display according to another exemplary embodiment of the disclosure. Referring to FIG. 3B and FIG. 6A, a bend detector 610A may be disposed on a first surface 620A of a flexible display 620, and a bend detector 610B may be disposed on a second surface 620B on the flexible display 620. Each of the foam conductive material layers of the bend detectors 610A and 610B are connected together and maintain closed-circuit status. Referring to FIG. 3B and FIG. 6B, in the condition that the flexible display 620 is bent toward the first surface 620A, the foam conductive material layer of the bend detector 610A at the bend position is squeezed and maintains closed-circuit status. The foam conductive material layers of the bend detector 610B at the bend position are separated and form an open-circuit. In this manner, the microcontroller may detect the bend position of the bend detector 610B on the flexible display 620 according to the foam conductive material layer of the bend detector 610B. On the contrary, in the condition that the flexible display 620 is bent toward the second surface 620B, the foam conductive material layer of the bend detector 610B at the bend position is squeezed and maintains closed-circuit status. The foam conductive material layers of the bend detector 610A at the bend position are separated and form open-circuit. In this manner, the microcontroller may detect the bend position of the bend detector 610A on the flexible display 620 according to the foam conductive material layer of the bend detector 610A.

Figure 7A:
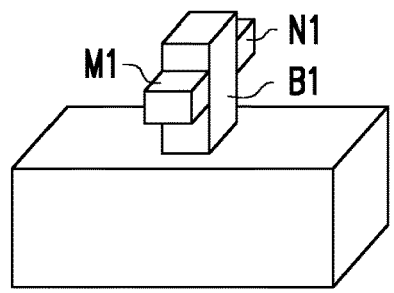
FIG. 7A to FIG. 7B are schematic views of a bend detector according to another exemplary embodiment of the disclosure.
Figure 7B:
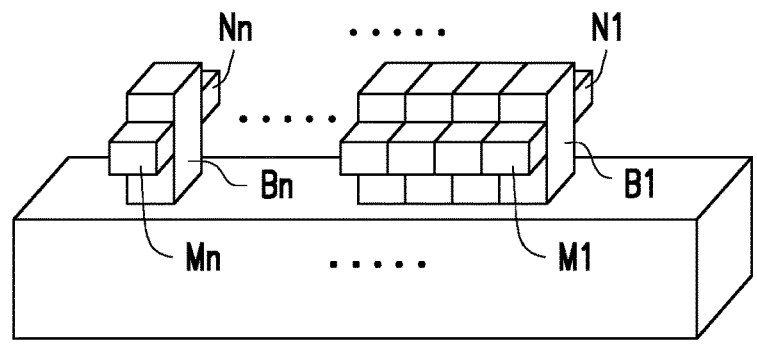

FIG. 7A to FIG. 7B are schematic views of a bend detector according to another exemplary embodiment of the disclosure. Referring to FIG. 7A, the bend detector may be formed as a structure in which the foam conductive material layers M1 and N1 are disposed on both sides of the substrate B1, and disposed on the lateral surface of the flexible display. It should be indicated that the foam conductive material layers M1 and N1 may be regarded as a parallel resistor. Referring to FIG. 7B, a plurality of foam conductive material layers M1-Mn and N1-Nn are respectively disposed on both sides of the substrates B1-Bn, and arranged on the lateral surface of the flexible display. In the condition that the flexible display is not bent, the plurality of foam conductive material layers M1-Mn and N1-Nn may be respectively and closely connected to adjacent foam conductive material layer and maintain closed-circuit status, which may be regarded that the plurality of resistors are connected in parallel.

Figure 8A:
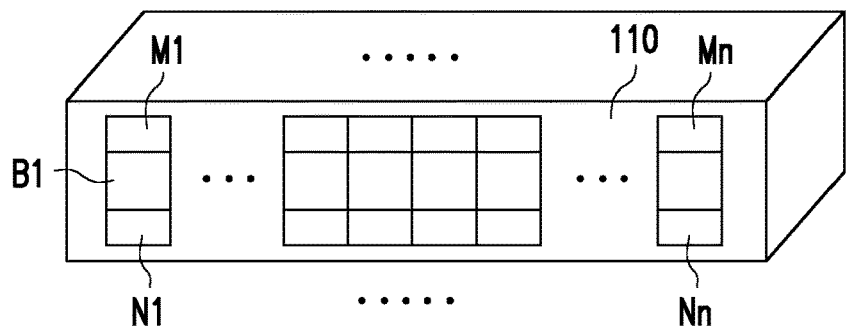
FIG. 8A and FIG. 8B are schematic views of a bend detector disclosed on a lateral surface of a flexible display according to an exemplary embodiment of the disclosure.
Figure 8B:
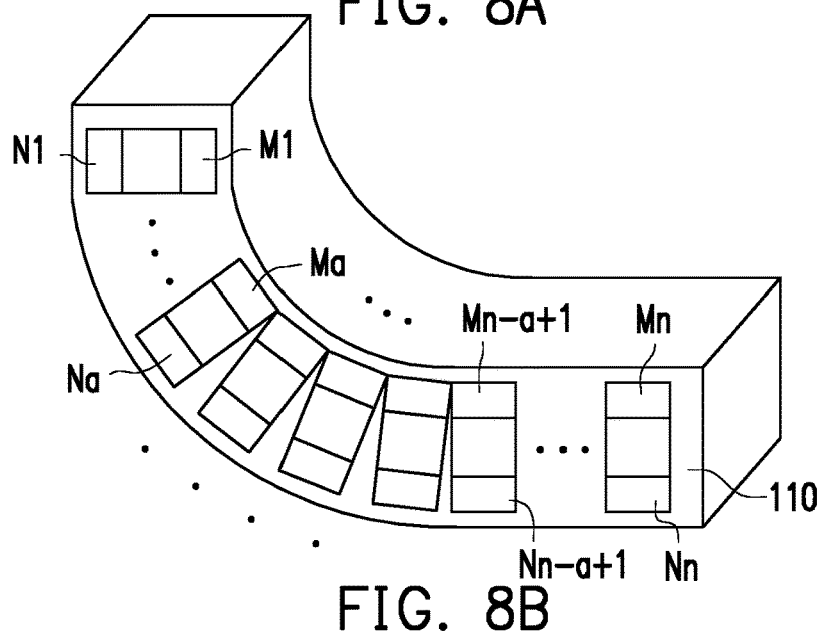

FIG. 8A and FIG. 8B are schematic views of a bend detector disclosed on a lateral surface of a flexible display according to an exemplary embodiment of the disclosure. Referring to FIG. 7B and FIG. 8A, the bend detector 120 may be disposed on any lateral surface or a plurality of lateral surfaces of the flexible display 110. In the condition that the flexible display 110 is not bent, the foam conductive material layers M1-Mn and N1-Nn of the bend detector 120 are connected together and maintain closed-circuit status. Referring to FIG. 7B and FIG. 8B, in the condition that the flexible display 110 is bent toward the direction of the foam conductive material layers M1-Mn, the foam conductive material layers Ma-Mn-a+1 at the bend position are squeezed with each other and connected together to form closed-circuit. On the contrary, the foam conductive material layers Na-Na-a+1 at the bend position are separated from each other and form open-circuit. Based on this, the microcontroller may detect the bend position of the bend detector on the flexible display according to the foam conductive material layers Na-Nn-a+1 of the bend detector. Relatively, in the condition that the flexible display 110 is bent toward the direction of the foam conductive material layers N1-Nn, the foam conductive material layers Na-Nn-a+1 at the bend position are squeezed with each other and connected together to form closed-circuit. On the contrary, the foam conductive material layers Ma-Mn-a+1 at the bend position are separated from each other and form open-circuit. In this manner, the microcontroller may detect the bend position of the bend detector on the flexible display according to the foam conductive material layers Ma-Mn-a+1 of the bend detector.

Figure 9:
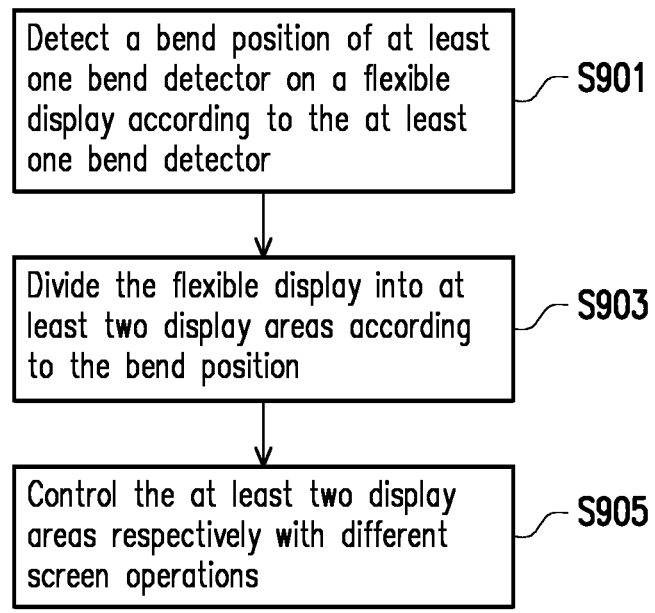
FIG. 9 is a flowchart showing a method of dividing a flexible display according to an exemplary embodiment of the disclosure.

FIG. 9 is a flowchart showing a method of dividing a flexible display according to an exemplary embodiment of the disclosure. Referring to FIG. 9, in step S901, the bend position of at least one bend detector on the flexible display is detected according to at least one bend detector. Specifically, the microcontroller determines whether the flexible display is bent according to the at least one bend detector and determines the bend position on the flexible display. In step S903, the flexible display is divided into at least two display areas according to the bend position. In step S905, the at least two display areas are controlled respectively with different screen operations. In other words, the processor may divide the flexible display into at least two display areas, and generate at least two divided images in the at least two display areas.

Figure 10:
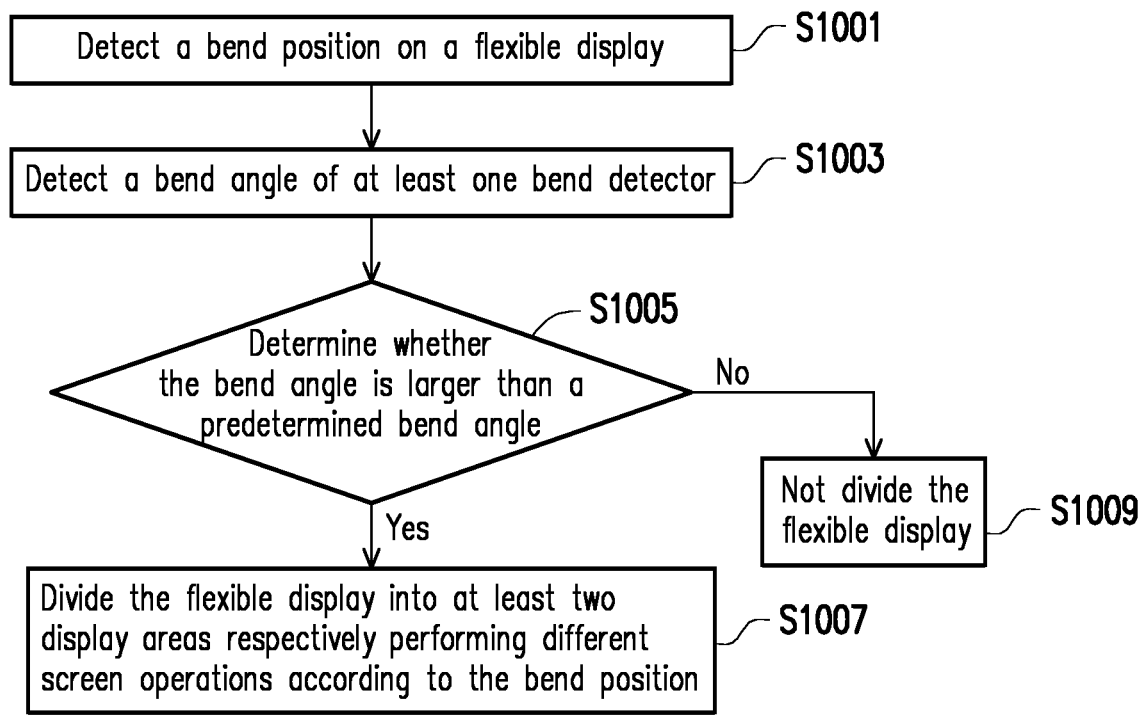
FIG. 10 is a flowchart showing a method of dividing a flexible display according to another exemplary embodiment of the disclosure.

FIG. 10 is a flowchart showing a method of dividing a flexible display according to another exemplary embodiment of the disclosure. Referring to FIG. 10, in step S1001, the bend position on the flexible display is detected. In step S1003, the bend angle of at least one bend detector is detected. In step S1005, it is determined whether the bend angle is larger than a predetermined bend angle. If so, in step S1007, the flexible display is divided into at least two display areas respectively performing different screen operations according to the bend position; if not, in step S1009, the flexible display is not divided. Furthermore, the processor determines whether to divide the flexible display into at least two display areas according to the detected bend angle and bend position.

In summary, the flexible display device provided in the disclosure detects the bend position on the flexible display to determine whether to divide the flexible display into at least two display images respectively performing different screen operations. In this manner, the flexible display device may determine how many display areas of the flexible display should be divided according to the status of how the user bends the flexible display, thereby achieving the effect of dividing image and respectively realizing different functions on the divided screens. Additionally, in the condition that the user bends the flexible display device randomly, the disclosure may dynamically determine the bend status of the flexible display device, thereby determining how many display images are required and the positions of the display images on the flexible display device. Accordingly, the disclosure may improve the efficiency of determining the number and position of the display images of the flexible display device.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A flexible display device, comprising:
    a flexible display;
    at least one bend detector, disposed on or in the flexible display;
    at least two gravity sensors, disposed at opposite corners of the flexible display;
    a microcontroller, coupled to the at least one bend detector and the at least two gravity sensors, the microcontroller detecting a bend position of the at least one bend detector on the flexible display according to the at least one bend detector and detecting a bend angle of the flexible display according to the at least two gravity sensors; and
    a processor, coupled to the microcontroller and the flexible display, the processor dividing the flexible display into at least two display areas according to the bend position and the bend angle, and respectively controlling the at least two display areas with different screen operations,
    wherein the at least one bend detector is linear and has a plurality of resistors connected in parallel,
    wherein the microcontroller detects a resistance of the at least one bend detector, and determines the bend position of the at least one bend detector according to the resistance,
    wherein an open-circuit is formed between individual resistors when the bend detector is bent and the bend angle of the at least one bend detector is inversely proportional to a number of the resistors which maintain a closed-circuit,
    wherein the processor presets a bend distance, the processor displays a position of the flexible display corresponding to the bend position as a blank image according to the bend distance, wherein the processor intercepts the bend distance from a length of the at least one bend detector in the bend position along the at least one bend detector to obtain the position of the flexible display.

2. The flexible display device according to claim 1, wherein the processor respectively sets the at least two display areas as a touch area, a display image or a closed image according to the bend angle.

3. The flexible display device according to claim 1, wherein the at least one bend detector is disposed on or in the flexible display through physical adhesive or a semiconductor manufacturing process.

4. The flexible display device according to claim 1, wherein the at least one bend detector is disposed on or in the flexible display along a lateral side, a bottom side or a diagonal line of the flexible display.

5. A method of dividing a flexible display, comprising:
    detecting a bend position of at least one bend detector on the flexible display according to the at least one bend detector;
    detecting a bend angle of the flexible display according to at least two gravity sensors disposed at opposite corners of the flexible display;
    dividing the flexible display into at least two display areas according to the bend position and the bend angle; and
    controlling the at least two display areas with two different screen operations respectively, wherein the method further comprising:
        setting the at least one bend detector as linear, wherein the at least one bend detector has a plurality of resistors connected in parallel; and
        detecting a resistance of the at least one bend detector, and determining the bend position of the at least one bend detector according to the resistance, wherein an open-circuit is formed between individual resistors when the bend detector is bent and the bend angle of the at least one bend detector is inversely proportional to a number of the resistors which maintain a closed-circuit, wherein the method further comprising:
            presetting a bend distance; and
            displaying a position of the flexible display corresponding to the bend position as a blank image according to the bend distance intercepted from a bend area of the bend position,
            wherein the position of the flexible display is obtained by intercepting the bend distance from a length of the at least one bend detector in the bend position along the at least one bend detector.

6. The method of dividing the flexible display according to claim 5, further comprising:
    setting the at least two display areas into a touch area, a display image or a closed image according to the bend angle.

7. The method of dividing the flexible display according to claim 5, further comprising:
    disposing the at least one bend detector on the flexible display through physical adhesive or a semiconductor manufacturing process.

8. The method of dividing the flexible display according to claim 5, further comprising:
    disposing the at least one bend detector on the flexible display along a lateral side, a bottom side or a diagonal line of the flexible display.

* * * * *